US011624858B2

(12) United States Patent
Yamane et al.

(10) Patent No.: US 11,624,858 B2
(45) Date of Patent: Apr. 11, 2023

(54) ANTIREFLECTIVE MEMBER AND METHOD OF MANUFACTURE THEREFOR

(71) Applicant: SHIN-ETSU CHEMICAL CO., LTD., Tokyo (JP)

(72) Inventors: Yuji Yamane, Annaka (JP); Lisa Katayama, Annaka (JP); Ryusuke Sakoh, Annaka (JP); Takashi Matsuda, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 219 days.

(21) Appl. No.: 16/603,134

(22) PCT Filed: Mar. 8, 2018

(86) PCT No.: PCT/JP2018/008900
§ 371 (c)(1),
(2) Date: Oct. 4, 2019

(87) PCT Pub. No.: WO2018/193742
PCT Pub. Date: Oct. 25, 2018

(65) Prior Publication Data
US 2021/0215853 A1 Jul. 15, 2021

(30) Foreign Application Priority Data
Apr. 20, 2017 (JP) .............................. JP2017-083634

(51) Int. Cl.
G02B 1/18 (2015.01)
C03C 17/42 (2006.01)
C09D 171/02 (2006.01)
C23C 14/08 (2006.01)
C23C 14/10 (2006.01)
C23C 14/24 (2006.01)
C23C 14/34 (2006.01)
G02B 1/115 (2015.01)
C03C 17/30 (2006.01)

(52) U.S. Cl.
CPC ............... G02B 1/18 (2015.01); C03C 17/30 (2013.01); C03C 17/42 (2013.01); C09D 171/02 (2013.01); C23C 14/083 (2013.01); C23C 14/10 (2013.01); C23C 14/24 (2013.01); C23C 14/34 (2013.01); G02B 1/115 (2013.01); C03C 2217/213 (2013.01); C03C 2217/734 (2013.01); C03C 2217/76 (2013.01); C03C 2218/151 (2013.01); C03C 2218/154 (2013.01)

(58) Field of Classification Search
CPC ...... C09D 171/00; C09D 171/02; C09D 5/16; C09D 183/00; C09D 183/04–16; C08G 65/336; C08G 77/24; C08G 77/46; C08G 2650/48; G02B 1/11–18; C03C 17/30; C03C 17/42; C03C 2217/75; C03C 2217/76
See application file for complete search history.

(56) References Cited

U.S. PATENT DOCUMENTS

| | | | |
|---|---|---|---|
| 2003/0139620 A1* | 7/2003 | Yamaguchi | C08G 65/007 359/885 |
| 2003/0181044 A1 | 9/2003 | Takahashi et al. | |
| 2004/0047047 A1* | 3/2004 | Yamaguchi | G02B 1/18 359/666 |
| 2004/0142185 A1* | 7/2004 | Takushima | C23C 14/243 428/447 |
| 2006/0166006 A1 | 7/2006 | Sasaki et al. | |
| 2007/0166522 A1* | 7/2007 | Beinat | G02B 1/116 428/212 |
| 2008/0114120 A1* | 5/2008 | Koike | C09D 171/02 524/588 |
| 2009/0011255 A1* | 1/2009 | Komai | C09D 4/00 428/447 |
| 2011/0117273 A1* | 5/2011 | Mitsuishil | D04H 1/4209 118/726 |
| 2012/0077041 A1 | 3/2012 | Yamane et al. | |
| 2012/0212826 A1* | 8/2012 | Henn | H01J 37/3467 359/586 |
| 2013/0016425 A1 | 1/2013 | Kusunoki | |

(Continued)

FOREIGN PATENT DOCUMENTS

| | | |
|---|---|---|
| JP | 2004-226942 A | 8/2004 |
| JP | 2004-271545 A | 9/2004 |

(Continued)

OTHER PUBLICATIONS

Okada et al, Defect analysis and lifetime evaluation of a release-coated nanoimprint mold, Microelectronic Engineering, vol. 123, 2014, p. 117-120.*
International Search Report (PCT/ISA/210) issued in PCT/JP2018/008900, dated Apr. 24, 2018.
Written Opinion of the International Searching Authority (PCT/ISA/237) issued in PCT/JP2018/008900, dated Apr. 24, 2018.

Primary Examiner — Z. Jim Yang
(74) Attorney, Agent, or Firm — Birch, Stewart, Kolasch & Birch, LLP

(57) ABSTRACT

Provided is an antireflective member that has a water- and oil-repellent layer on a multi-layered antireflective layer and is capable of exhibiting excellent surface lubricity, water- and oil-repellent properties, and durability. The surface of the multi-layered antireflective layer on a base material has a root-mean-square surface roughness of 0.8 nm to 2.0 nm. The water- and oil-repellent layer has a thickness of 1 to 30 nm and is a cured product of water- and oil-repellents having as principal components a fluorooxyalkylene group-containing polymer modified organosilicon compound with the numerical average molecular weight of 4,500 to 10,000 of a fluoropolymer part and/or partial hydrolysis condensate thereof.

6 Claims, No Drawings

(56) References Cited

U.S. PATENT DOCUMENTS

| | | | |
|---|---|---|---|
| 2013/0136928 A1* | 5/2013 | Yamane | C09D 183/12 428/421 |
| 2014/0177053 A1* | 6/2014 | Cadet | G02B 1/115 359/507 |
| 2015/0004419 A1* | 1/2015 | Yamane | C09D 183/14 428/447 |
| 2015/0138638 A1* | 5/2015 | Mashimo | G02B 1/115 359/581 |
| 2015/0275035 A1* | 10/2015 | Yamane | C03C 17/30 428/447 |
| 2015/0307719 A1* | 10/2015 | Mitsuhashi | C07F 7/188 428/447 |
| 2015/0322270 A1* | 11/2015 | Amin | C03C 21/002 428/141 |
| 2015/0338552 A1* | 11/2015 | Fujii | G02B 1/18 359/601 |
| 2016/0040039 A1* | 2/2016 | Yamane | C08G 65/007 524/588 |
| 2016/0137878 A1* | 5/2016 | Yamane | C09D 183/00 528/36 |
| 2017/0129806 A1* | 5/2017 | Fujii | G02B 27/0006 |
| 2017/0233602 A1* | 8/2017 | Itami | C09D 5/1637 428/426 |
| 2017/0349785 A1* | 12/2017 | Galvez | B05D 3/0466 |
| 2018/0112082 A1* | 4/2018 | Hamade | C08G 77/18 |
| 2018/0186820 A1* | 7/2018 | Katsukawa | C08G 65/336 |
| 2018/0230331 A1* | 8/2018 | Harada | C09D 7/63 |
| 2019/0177574 A1* | 6/2019 | Takeda | C08G 77/54 |
| 2019/0300717 A1* | 10/2019 | Akaishi | C09D 171/02 |
| 2021/0199857 A1* | 7/2021 | Honda | C08L 71/02 |
| 2021/0277258 A1* | 9/2021 | Mitsuhashi | C08G 65/04 |

FOREIGN PATENT DOCUMENTS

| | | |
|---|---|---|
| JP | 2005-199572 A | 7/2005 |
| JP | 2006-201558 A | 8/2006 |
| JP | 2011-150286 A | 8/2011 |
| JP | 2012-72272 A | 4/2012 |
| JP | 2014-194530 A | 10/2014 |
| WO | WO 2014/129333 A1 | 8/2014 |
| WO | WO 2015/159839 A1 | 10/2015 |
| WO | WO-2018034138 A1 * | 2/2018 ............ C03C 17/30 |

* cited by examiner

ANTIREFLECTIVE MEMBER AND METHOD OF MANUFACTURE THEREFOR

TECHNICAL FIELD

The present invention relates to an antireflective member and a method of manufacture therefor, and more specifically, relates to an antireflective member that has a water- and oil-repellent layer on a multi-layered antireflective layer and is capable of exhibiting excellent surface lubricity, water- and oil-repellent properties, and durability. The surface of the multi-layered antireflective layer on a base material has a root-mean-square surface roughness of 0.8 nm or more and 2.0 nm or less. The water- and oil-repellent layer has a thickness of 1 to 30 nm and is a cured product of water- and oil-repellents having as principal components a fluorooxyalkylene group-containing polymer modified organosilicon compound with the numerical average molecular weight of 4,500 or more and 10,000 or less of a fluoropolymer part and/or partial hydrolysis condensate thereof.

BACKGROUND ART

In recent years, in order to improve the appearance and visibility, demands for technology to make fingerprints hard to attach on a surface of an optical article and technology to easily remove dirt have been increasing year by year. Since sebum dirt tends to be attached to the surface, it is desirable to provide a water- and oil-repellent layer.

In order to solve such a problem, as a treating agent capable of performing water- and oil-repellent treatment on the surface of a base material such as glass, for example, in Patent Document 1 (JP-A 2012-072272) discloses a linear fluorooxyalkylene group-containing polymer represented by the following average composition formula:

[Chem. 1]

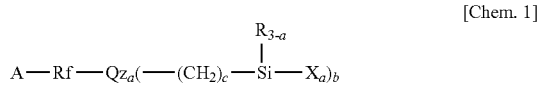

wherein, an Rf group is $-(CF_2)_d-(OC_2F_4)_e(OCF_2)_f-O(CF_2)_d-$, A is a monovalent fluorine-containing group whose terminal is a $-CF_3$ group, and Q is divalent organic group, Z is a divalent to octavalent organopolysiloxane residue having a siloxane bond, R is an alkyl group having 1 to 4 carbon atoms or a phenyl group, and X is a hydrolyzable group, a is 2 or 3, b is an integer of 1 to 6, c is an integer of 1 to 5, a is 0 or 1, d is each independently an integer of 0 or 1 to 5, e is an integer of 0 to 80, f is an integer of 0 to 80, and e+f is an integer of 5 to 100, and repeating units may be randomly combined.

The water- and oil-repellent treated substrate proposed in Patent Document 1 exhibits steel wool resistance and excellent low dynamic friction in a case where the above-mentioned surface treatment agent is applied after glass is coated with a $SiO_2$ layer of 10 nm.

On the other hand, in a case of the antireflective film generally provided on these surfaces, there is a drawback in that contamination is more noticeable than in a case of a mere transparent surface or the like, for example, contaminants such as finger marks, fingerprints, sweat, saliva, hair setting agents and the like are easily attached, the surface reflectance changes due to the attachment, and the attached matter appears white which makes display contents unclear. In general, it is necessary to apply many layers in order to lower the reflectance, and since it is extremely difficult to make the surface of the antireflective film as smooth as the glass substrate, it is difficult to secure surface lubricity and abrasion resistance.

Although root-mean-square surface roughness (hereinafter, may be abbreviated as RMS in some cases) of a $SiO_2$ layer substrate used in the example described in Patent Document 1 is 0.48 nm; however, at present, the RMS of the antireflective layer can be controlled by mass production at 1.0 nm.

Even though the treatment agent described in Patent Document 1 was applied to a multi-layer antireflective film, the steel wool resistance and the low dynamic friction were insufficient.

Therefore, development of a water- and oil-repellent treatment agent that can exhibit excellent surface lubricity and abrasion resistance even on an antireflective film having an RMS of 0.8 nm or more has been required.

PRIOR ART DOCUMENTS

Patent Documents

Patent Document 1: JP-A 2012-072272

SUMMARY OF INVENTION

Technical Problem

The present invention has been made in view of the above circumstances, and an object of the present invention is to provide an antireflective member excellent in surface lubricity and abrasion resistance and a method of manufacture therefor.

Solution to Problem

The inventors of the present invention have conducted intensive studies to achieve the above object, and as a result, it has been found as follows: an antireflective member has a water- and oil-repellent layer on a multi-layered antireflective layer and is capable of exhibiting excellent surface lubricity, water- and oil-repellent properties, and durability. The surface of the multi-layered antireflective layer on a base material has an RMS (root-mean-square surface roughness or root-mean-square-roughness, roughness by root mean square, that is, surface roughness by the square root of the mean of the squares of the deviation from the mean line to the measurement curve) of 0.8 nm or more and to 2.0 nm or less. The water- and oil-repellent layer has a thickness of 1 to 30 nm and is a cured product of water- and oil-repellents having as principal components a fluorooxyalkylene group-containing polymer modified organosilicon compound with the numerical average molecular weight of 4,500 or more and 10,000 or less of a fluoropolymer part and/or partial hydrolysis condensate thereof. With this, the present invention has completed.

That is, the present invention provides an antireflective member having excellent surface lubricity, water- and oil-repellent properties, and durability, and a method of manufacture therefor.

[1]

An antireflective member containing a water- and oil-repellent layer that has a thickness of 1 to 30 nm and is a cured product of water- and oil-repellents having as principal components a fluorooxyalkylene group-containing polymer modified organosilicon compound with a numerical average molecular weight of 4,500 or more and 10,000 or less of a fluoropolymer part and/or partial hydrolysis condensate thereof, on a multi-layered antireflective layer in which a surface of the multi-layered antireflective layer on a base material has a root-mean-square surface roughness of 0.8 nm or more and 2.0 nm or less.

[2]

The antireflective member according to [1], wherein the multi-layered antireflective layer is a multi-layered antireflective layer using at least two kinds selected from $MgF_2$, MgO, SiO, $SiO_2$, $CeF_3$, $NdF_3$, $LaF_3$, $AlF_3$, $YF_3$, $BaF_2$, $CaF_2$, $Al_2O_3$, $SiN_x$ (x is a positive number of 1 to 1.5) ITO, $In_2O_3$, $SnO_2$, $ZrO_2$, $TiO_2$, $Ti_4O_7$, $Ti_3O_5$, $TiN_{x'}O_y$ (x' is a positive number of 1 to 4 and y is a positive number of 1 to 12), $Nb_2O_5$, $Ta_2O_5$, $Y_2O_3$, ZnS, $WO_3$ $HfO_2$, and $La_2Ti_2O_7$.

[3]

The antireflective member according to [1] or [2], wherein the multi-layered antireflective layer is a vacuum vapor deposition film, an ion plating film, an ion assist film, a sputtering film, or a plasma CVD film.

[4]

The antireflective member according to any one of [1] to [3], wherein the fluorooxyalkylene group-containing polymer modified organosilicon compound is at least one selected from compounds represented by the following general formulae (1), (2), (3), (4) and (5):

$$(A-Rf)_\alpha\text{---}ZW_\beta \quad (1)$$

$$Rf\text{---}(ZW_\beta)_2 \quad (2)$$

$$Z'\text{---}(Rf\text{---}ZW_\beta)_\gamma \quad (3)$$

wherein, Rf is —$(CF_2)_d$—O—$(CF_2O)_p(CF_2CF_2O)_q$ $(CF_2CF_2CF_2O)_r(CF_2CF_2CF_2CF_2O)_s(CF(CF_3)CF_2O)_t$— $(CF_2)_d$—, d is an integer of 0 to 8, p, q, r, s, and t are each independently an integer of 0 to 200, p+q+r+s+t+2d is a number allowing a fluoropolymer part to have the numerical average molecular weight of 4,500 or more and 10,000 or less, and each unit indicated in parentheses may be randomly combined, A is a fluorine atom, a hydrogen atom, or a monovalent fluorine-containing group whose terminal is a —$CF_3$ group, a —$CF_2H$ group, or a —$CH_2F$ group, and Z and Z' are independently a single bond or a divalent to octavalent organic group which may contain a nitrogen atom, an oxygen atom, a silicon atom, a phosphorus atom, or a sulfur atom, and may be substituted with fluorine, and W is independently a monovalent organic group having a hydrolyzable group at a terminal, α and β are each independently an integer of 1 to 7, and α+β is 2 to 8, and γ is an integer of 2 to 8, $$A\text{-}Rf\text{-}Q\text{-}(Y)_\delta\text{---}B \quad (4)$$

$$Rf\text{-}(Q\text{-}(Y)_\delta\text{---}B)_2 \quad (5)$$

wherein, Rf and A are as defined above, Q is a single bond or a divalent organic group, Y is a divalent organic group having a hydrolyzable group, δ is an integer of 1 to 10, and B is a hydrogen atom, an alkyl group having 1 to 4 carbon atoms, or a halogen atom.

[5]

The antireflective member according to [4], wherein Rf in the formulae (1) to (5) has a linear structure.

[6]

The antireflective member according to [5], wherein Rf in the formulae (1) to (5) contains —$CF_2CF_2O$—.

[7]

The antireflective member according to any one of [1] to [6], wherein the fluorooxyalkylene group-containing polymer modified organosilicon compound is represented by the following formulae:

[Chem. 2]

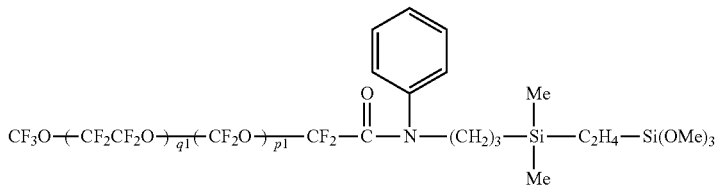

[Chem. 3]

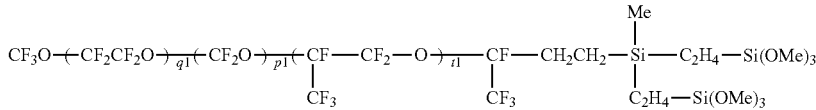

[Chem. 4]

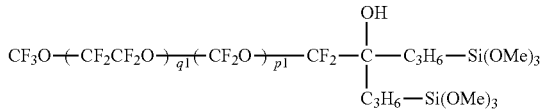

[Chem. 5]

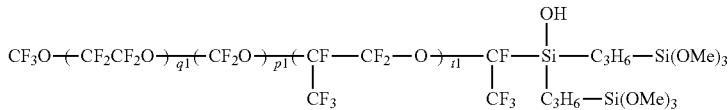

[Chem. 6]

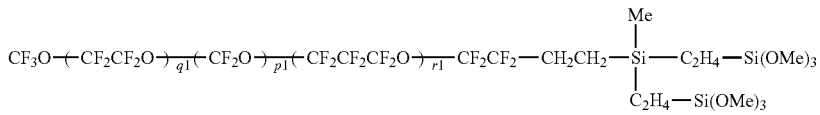

-continued
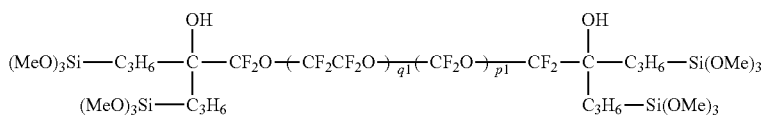
[Chem. 7]
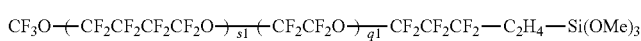
[Chem. 8]
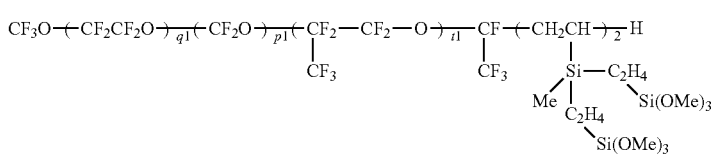
[Chem. 9]
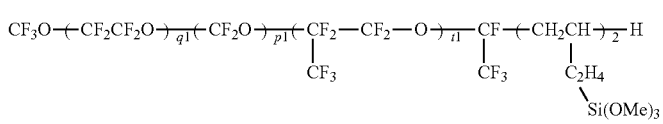
[Chem. 10]
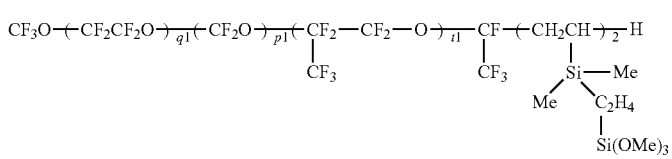
[Chem. 11]
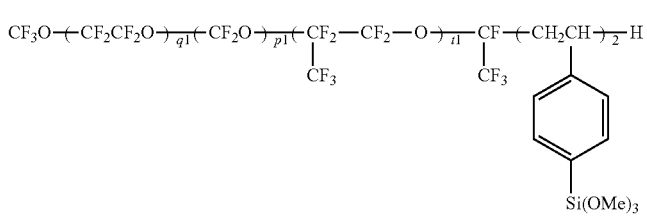
[Chem. 12]
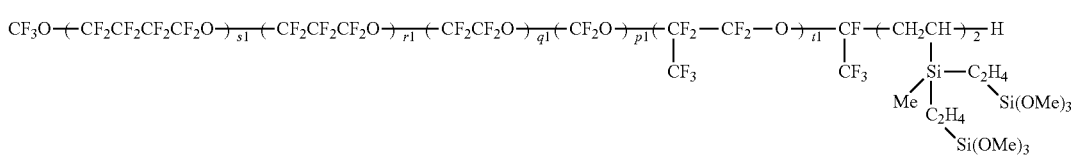
[Chem. 13]
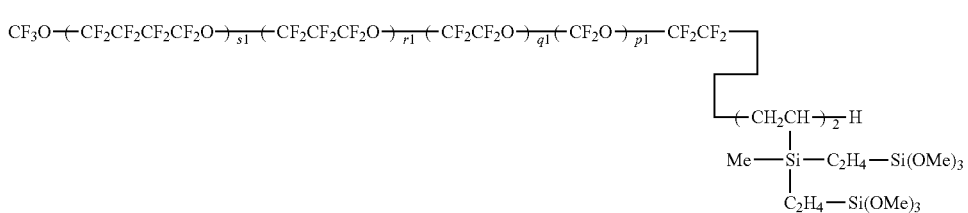
[Chem. 14]
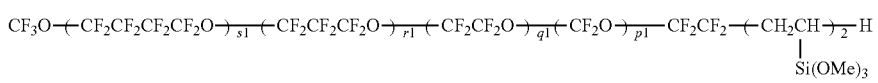
[Chem. 15]
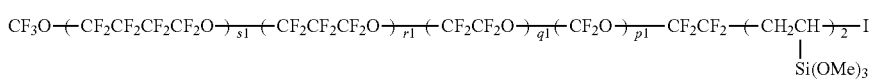
[Chem. 16]
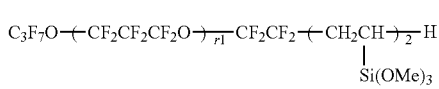
[Chem. 17]
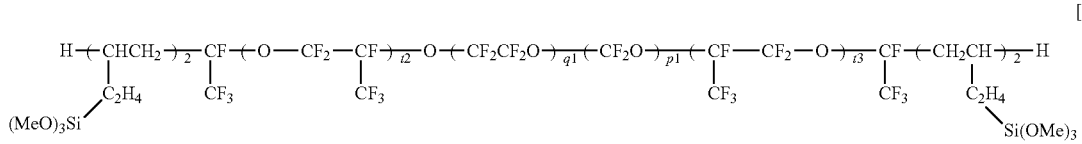
[Chem. 18]

[Chem. 19]

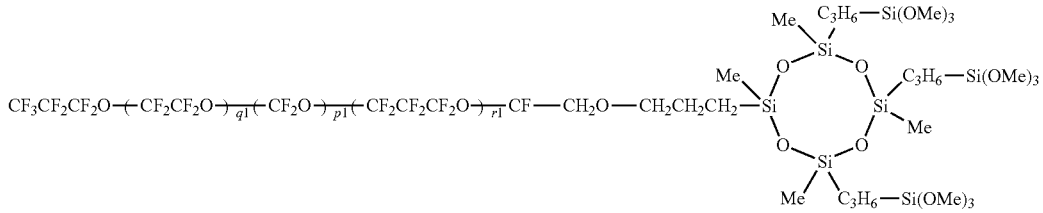

[Chem. 20]

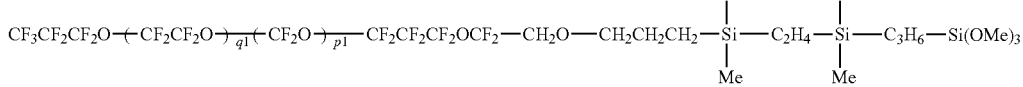

[Chem. 21]

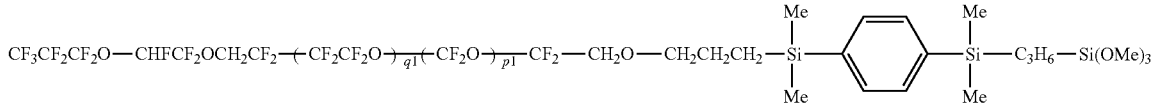

[Chem. 22]

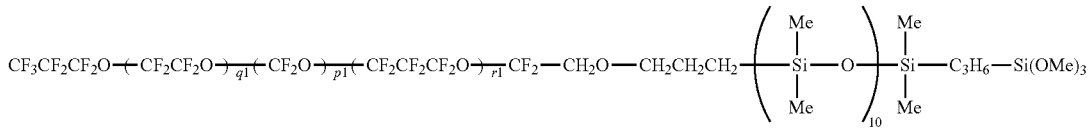

[Chem. 23]

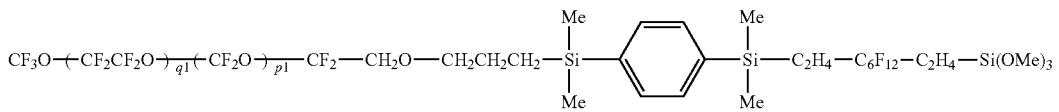

wherein, Me is a methyl group, p1, q1, r1, s1, and t1 are each independently an integer of 1 to 200, t2+t3=t1, and the numerical average molecular weight of the fluoropolymer part is 4,500 to 10,000, and in addition, each unit indicated in parentheses may be randomly combined.

[8]

The antireflective member according to any one of [1] to [7], wherein the base material is glass, sapphire, quartz or a transparent resin.

[9]

A method of manufacture for the antireflective member according to any one of [1] to [8], the method including: a step of forming a multi-layered antireflective layer by depositing at least two kinds of antireflective agents a plurality of times by using a vacuum deposition method, an ion plating method, an ion assist method, a sputtering method, or a plasma CVD method, on a base material to make root-mean-square surface roughness of the surface 0.8 nm or more and 2.0 nm or less; and a step of depositing a water- and oil-repellent having as principal components a fluorooxyalkylene group-containing polymer modified organosilicon compound and/or a partial hydrolysis condensate thereof on the multi-layered antireflective layer by the vacuum deposition method, a spray method, a Dip method, or a spin method to form a water- and oil-repellent layer.

Advantageous Effects of Invention

According to the present invention, an antireflective member having excellent surface lubricity, water- and oil-repellent properties, and durability can be manufactured, and in particular, it can be suitably used for optical applications. For example, it is useful for touch panel displays such as smartphones, watches, tablet PCs, PCs, TVs, car navigation systems, ticket vending machines, security devices, refrigerators, microwave ovens, game devices, and the like, and lenses such as vision correction glasses, AR glasses, VR glasses, and cameras, and cover members.

DESCRIPTION OF EMBODIMENTS

Hereinafter, the present invention is described in more detail.

The antireflective member of the present invention contains a water- and oil-repellent layer that has a thickness of 1 to 30 nm and is a cured product of water- and oil-repellents having as principal components a fluorooxyalkylene group-containing polymer modified organosilicon compound with a numerical average molecular weight of 4,500 or more and 10,000 or less of a fluoropolymer part and/or partial hydrolysis condensate thereof, on a multi-layered antireflective layer in which a surface of the multi-layered antireflective layer on a base material has a root-mean-square surface roughness (RMS) of 0.8 nm or more and 2.0 nm or less.

The present invention is obtained by providing antireflective layer surfaces having a multi-layer structure on various base materials (glass, sapphire, quartz, and a transparent resin), and a water- and oil-repellent layer having a thickness of 1 to 30 nm which is obtained by curing the water- and oil-repellents having as principal components the fluorooxyalkylene group-containing polymer modified organosilicon compound and/or the partial hydrolysis condensate thereof on the multi-layered antireflective layer. As a result of intensive studies by the inventors of the present invention, it was found that the lubricity and the abrasion resistance of the water- and oil-repellent layer on the multi-layered antireflective layer are excellent as the RMS of the multi-layered antireflective layer is smaller. Since the RMS of the multi-layered antireflective layer currently mass-produced is as large as about 1.0 nm, it is necessary to perform a treatment with a polymer which has the numerical average molecular weight of the fluoropolymer part of the fluorooxyalkylene group-containing polymer modified organosilicon compound is 4,500 or more and 10,000 or less in a high molecular weight range as compared with the prior art. In a case where the RMS of the multi-layered antireflective layer is less than 0.8 nm, desired performance can be imparted even if the numerical average molecular weight of the fluoropolymer part of the fluorooxyalkylene group-containing polymer modified organosilicon compound is 4,000 or less; however, at present, it is difficult to stably control RMS to less than 0.8 nm in an antireflective film having a multi-layer structure.

Examples of the base material to be treated by the above method used in the present invention include glasses such as soda glass and alkali aluminosilicate glass, sapphire, quartz, and a transparent resin.

The base material surface is preferably as smooth as possible, and, for example, the RMS is preferably 0.1 to 1.0 nm.

In a case where the antireflective layer is provided only on one side of the base material, the multi-layered antireflective layer used in the present invention means a film having a multi-layer structure (that is, two or more layers) coated a plurality of times with at least two antireflective agents such that the reflectance of the base material of at least light in the visible region (for example, light with a wavelength of 550 nm) is lowered (for example, to be reflectance of 0.1% to 7.0%, especially 0.1% to 5.0%). In addition, in a case where an antireflective layer is provided on both sides of the base material, it means a film provided such that the reflectance of the base material of at least light in the visible region (for example, to be light with a wavelength of 550 nm) is lowered (for example, reflectance of 0.1% to 4.0%, especially 0.1% to 2.0%).

Examples of the composition of the antireflective agent used in the antireflective layer include $MgF_2$, MgO, SiO, $SiO_2$, $CeF_3$, $NdF_3$, $LaF_3$, $AlF_3$, $YF_3$, $BaF_2$, $CaF_2$, $Al_2O_3$, $SiN_x$ (x is a positive number of 1 to 1.5), ITO, $In_2O_3$, $SnO_2$, $ZrO_2$, $TiO_2$, $Ti_2O_3$, $Ti_4O_7$, $Ti_3O_5$, $TiN_xO_y$ (x' is a positive number of 1 to 4, y is a positive number of 1 to 12), $Nb_2O_5$, $Ta_2O_5$, $Y_2O_3$, ZnS, $WO_3$, $HfO_2$, and $La_2Ti_2O_7$, and $MgF_2$, $SiO_2$, $CeF_3$, $Al_2O_3$, $SiN_x$, ITO, $ZrO_2$, $TiO_2$, $TiN_xO_y$, $Nb_2O_5$, $Ta_2O_5$, and $Y_2O_3$ are preferable, and a mixture of two or more of these may be used. In addition, it is preferable to set a multi-layered antireflective layer having a multi-layer structure with each different layers of two or more layers, preferably three or more layers, and more preferably four to eight layers by sequentially laminating the antireflective agents having two or more the above compositions.

These antireflective layers are applied by any of a vacuum deposition method, an ion plating method, a sputtering method, a plasma CVD method, and an ion assist method. Since it is more efficient to apply the antireflective layer and the water- and oil-repellent layer in the same apparatus, a vacuum vapor deposition apparatus or an apparatus in which a vacuum vapor deposition unit is incorporated into a sputtering apparatus is preferable. In addition, when forming the antireflective layer, it is desirable to rotate and/or revolve a sample.

The thickness of the (entire) multi-layered antireflective layer is preferably 100 to 1,000 nm, and more preferably 200 to 800 nm. If the thickness of the entire multi-layered antireflective layer is too thin, the antireflection effect may be small, and if too thick, the RMS of the surface of the multi-layered antireflective layer may be large. In the present invention, the thickness of the multi-layered antireflective layer or the like can be measured by spectroscopic ellipsometry (M-2000D manufactured by J.A. Woollam) (the same applies hereinafter).

It is important to control the RMS (root-mean-square surface roughness or root-mean-square-roughness) of the multi-layered antireflective layer surface to be 0.8 nm or more and 2.0 nm or less, preferably 0.80 nm or more and 1.9 nm or less, and more preferably 0.81 nm or more and 1.89 nm. If the RMS is more than 2.0 nm, it is difficult to exhibit sufficient lubricity and abrasion resistance even when laminating the water- and oil-repellent layer made of a cured product of a fluorooxyalkylene group-containing polymer modified organosilicon compound (water- and oil-repellent). Therefore, it is conceivable to further increase the numerical average molecular weight of the fluorooxyalkylene group-containing polymer modified organosilicon compound; however, it is very difficult in practice. In addition, it is extremely difficult to control the RMS of the multi-layered antireflective layer to less than 0.8 nm. Note that, in the present invention, the root-mean-square surface roughness (RMS) can be measured by a scanning probe microscope (SPA 300, cantilever: SI-DF 20, manufactured by Hitachi High-Tech Science Corporation).

Next, the water- and oil-repellent is applied to the surface of the formed antireflective layer and cured to form a water- and oil-repellent layer. As the water- and oil-repellent, one having as principal components the fluorooxyalkylene group-containing polymer modified organosilicon compound with the numerical average molecular weight of 4,500 or more and 10,000 or less of the fluoropolymer part and/or partial hydrolysis condensate thereof is used.

The fluorooxyalkylene group-containing polymer modified organosilicon compound is more specifically described.

The fluorooxyalkylene group-containing polymer modified organosilicon compound contains at least one hydrolyzable group (for example, a silicon atom-bonded organooxy group such as an alkoxy group bonded to a silicon atom) bonded to a silicon atom in one molecule, and in particular, 2 to 9 molecules, particularly 6 to 9 molecules are preferable. The fluorooxyalkylene group is a divalent polymer residue having a (poly)fluorooxyalkylene structure in which a plurality of repeating units represented by —$C_jF_{2j}O$— are bonded (in the structure, j is an integer of 1 or more, preferably 1 to 6, and more preferably 1 to 4).

In the present invention, as the fluorooxyalkylene group-containing polymer modified organosilicon compound, those having the numerical average molecular weight of the fluoropolymer part (that is, the divalent polymer residue having a (poly)fluorooxyalkylene structure) which is 4,500 to 10,000, preferably 5,000 to 9,000, and more preferably 5,500 to 7,500 are used. If the numerical average molecular weight is less than 4,500, the excellent lubricity and abrasion resistance is not possible to be compatible, and if it exceeds 10,000, not only the production itself is difficult but also the ratio of functional groups to the length of the polymer is reduced, the adhesion becomes worse. In addition, in the present invention, the numerical average molecular weight of the divalent polymer residue (fluoropolymer part) having a (poly)fluorooxyalkylene structure can be measured by $^{19}$F-NMR.

The repeating unit —$C_jF_{2j}O$— may be linear or branched. For example, the following units may be mentioned, and two or more of these repeating units may be bonded to each other.

—$CF_2O$—

—$CF_2CF_2O$—

—$CF_2CF_2CF_2O$—

—$CF(CF_3)CF_2O$—

—$CF_2CF_2CF_2CF_2O$—

—$CF_2CF_2CF_2CF_2CF_2O$—

—$C(CF_3)_2O$—

In particular, it is preferable that the (poly)fluorooxyalkylene structure having the above-mentioned numerical average molecular weight of 4,500 to 10,000 is —$(CF_2)_d$—$O$—$(CF_2O)_p(CF_2CF_2O)_q(CF_2CF_2CF_2O)_r(CF_2CF_2CF_2CF_2O)_s(CF(CF_3)CF_2O)_t CF_2)_d$—, d is an integer of 0 to 8, and p, q, r, s, and t are each independently an integer of 0 to 200.

Specific examples of the (poly)fluorooxyalkylene structure include those described below:

randomly combined, A is a fluorine atom, a hydrogen atom, or a monovalent fluorine-containing group whose terminal is a —$CF_3$ group, a —$CF_2H$ group, or a —$CH_2F$ group, and Z and Z' are independently a single bond or a divalent to octavalent organic group which may contain a nitrogen atom, an oxygen atom, a silicon atom, a phosphorus atom, or a sulfur atom, and may be substituted with fluorine, and W is independently a monovalent organic group having a hydrolysable group at a terminal, α and β are each independently an integer of 1 to 7, and α+β is 2 to 8, γ is an integer of 2 to 8, and Q is a single bond or a divalent organic group, Y is a divalent organic group having a hydrolyzable group, δ is an integer of 1 to 10, and B is a hydrogen atom, an alkyl group having 1 to 4 carbon atoms, or a halogen atom.]

In the above formulae (1) to (5), Rf is —$(CF_2)_d$—$O$—$(CF_2O)_p(CF_2CF_2O)_q(CF_2CF_2CF_2O)_r(CF_2CF_2CF_2CF_2O)_s(CF(CF_3)CF_2O)_tCF_2)_d$—, d is an integer of 0 to 8 and preferably 1 to 4, p, q, r, s, and t are each independently an integer of 0 to 200, preferably, p is an integer of 10 to 100, q is an integer of 1 to 70, r is an integer of 0 to 60, s is an integer of 0 to 50, t is an integer of 0 to 40, p+q+r+s+t+2d is a number allowing a fluoropolymer part to have the numerical average molecular weight of 4,500 or more and 10,000 or less, and each unit indicated in parentheses may be

[Chem 24.]

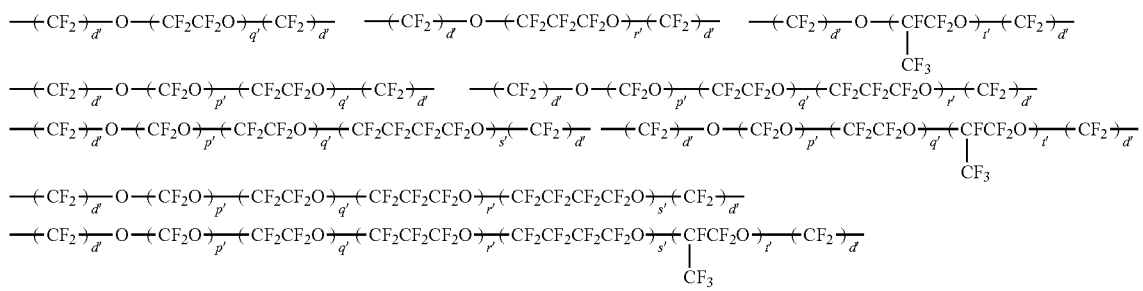

wherein, d' is an integer of 0 to 5, p', q', r', s, and t' are each independently an integer of 1 to 200, and the numerical average molecular weight of the structure is 4,500 to 10,000.

As the fluorooxyalkylene group-containing polymer modified organosilicon compound used in the present invention, a fluorine-containing organic silicon compound represented by any of the following formulae (1) to (5) is more preferably used. One of these may be used alone, or two or more may be used in combination.

(A-Rf)$_α$—ZW$_β$  (1)

Rf—(ZW$_β$)$_2$  (2)

Z'—(Rf—ZW$_β$)$_γ$  (3)

A-Rf-Q-(Y)$_δ$—B  (4)

Rf-(Q-(Y)$_δ$—B)$_2$  (5)

[In the formulae (1) to (5), Rf is —$(CF_2)_d$—$O$—$(CF_2O)_p(CF_2CF_2O)_q(CF_2CF_2CF_2O)_r(CF_2CF_2CF_2CF_2O)_s(CF(CF_3)CF_2O)_t$—$(CF_2)_d$—, d is an integer of 0 to 8, p, q, r, s, and t are each independently an integer of 0 to 200, p+q+r+s+t+2d is a number allowing a fluoropolymer part to have the numerical average molecular weight of 4,500 or more and 10,000 or less, and each unit indicated in parentheses may be randomly combined. Specifically, those exemplified as the above (poly)fluorooxyalkylene structure can be mentioned.

Note that, Rf preferably has a linear structure, and more preferably contains a repeating unit of —$CF_2CF_2O$—.

In the above formulae (1) and (4), A is a fluorine atom, a hydrogen atom, or a monovalent fluorine-containing group whose terminal is a —$CF_3$ group, a —$CF_2H$ group, or a —$CH_2F$ group. Among them, the —$CF_3$ group, the —$CF_2CF_3$ group, and the —$CF_2CF_2CF_3$ group are preferable.

In the above formulae (1) to (3), Z and Z' are a single bond or a divalent to octavalent organic group which may contain a nitrogen atom, an oxygen atom, a silicon atom, a phosphorus atom, or a sulfur atom, and may be substituted with fluorine. The organic group can be represented by -Q-M(–)$_k$.

Q is a single bond or a divalent organic group, and is a linking group between an Rf group and an M group. As Q, an amide bond, an ether bond, an ester bond, or an unsubstituted or substituted divalent organic group having 2 to 12 carbon atoms which may contain one or more selected from a diorganosilylene group such as dimethylsilylene group, diethylsilylene group, diphenylsilylene group, a group represented by —$Si[OH][(CH_2)_fSi(CH_3)_3]$— (f is an integer of 2 to 4), and a diorganosiloxane group is preferable. More preferably, it is an unsubstituted or substituted divalent hydrocarbon group having 2 to 12 carbon atoms which may contain the aforementioned bond.

The unsubstituted or substituted divalent hydrocarbon group having 2 to 12 carbon atoms represented by the above Q is, for example, an ethylene group, a propylene group (trimethylene group, methylethylene group), a butylene group (tetramethylene group, methylpropylene group), an alkylene group such as a hexamethylene group and an octamethylene group, an arylene group such as phenylene group, or a combination of two or more of these groups (such as alkylene and arylene group). Furthermore, a group obtained by substituting some or all of the hydrogen atoms bonded to the carbon atoms of these groups by a halogen atom such as fluorine may be used. Among them, an unsubstituted or substituted alkylene group having 2 to 4 carbon atoms or a phenylene group is preferable.

Examples of Q include a group represented by the following structure, or a group in which two or more of these groups are bonded to each other:

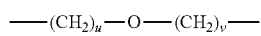

[Chem. 25]

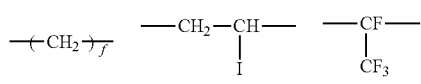

[Chem. 26]

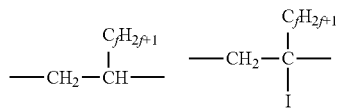

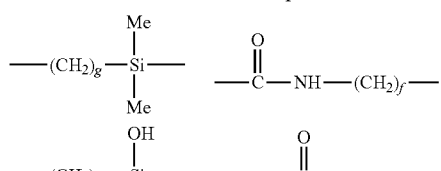

[Chem. 27]

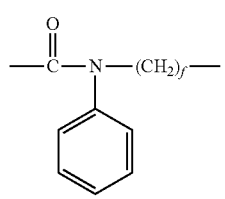

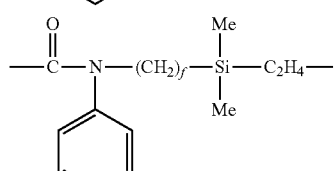

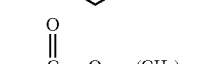

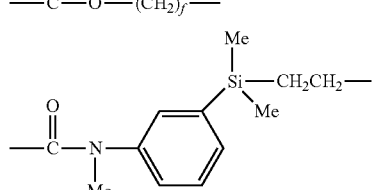

-continued

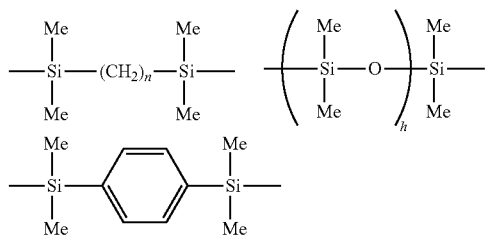

[Chem. 28]

wherein, f is an integer of 2 to 4, n is an integer of 2 to 6 and preferably 2 to 4, u, v, and g are an integer of 1 to 4, h is an integer of 1 to 50 and preferably an integer of 1 to 10, and Me is a methyl group.

k is an integer of 1 to 7 and preferably an integer of 1 to 5.

M's are independently a single bond, a group selected from a divalent group represented by $-R^1{}_2C-$, a divalent group represented by $-R^3{}_2Si-$, a trivalent group represented by $-R^1C=$, a trivalent group represented by $-R^3Si=$, a tetravalent group represented by a tetravalent group represented by and a tetravalent group represented by or a divalent to octavalent siloxane residue. In the above description, $R^1$ is preferably independently an alkyl group having 1 to 3 carbon atoms, a hydroxyl group, a group represented by $CH_3(OCH_2CH_2)_i-O-$ (i is an integer of 1 to 20), or a silyl ether group represented by $R^2{}_3SiO-$, and $R^2$'s are independently a hydrogen atom, preferably an alkyl group having 1 to 3 carbon atoms, an aryl group such as a phenyl group, or an alkoxy group having 1 to 3 carbon atoms. $R^3$ independently is preferably an alkyl group having 1 to 3 carbon atoms, an alkenyl group having 2 or 3 carbon atoms, an alkoxy group having 1 to 3 carbon atoms, or a chlor group. In a case where M is a divalent to octavalent siloxane residue, it preferably has a linear, branched, or cyclic organopolysiloxane structure having 2 to 13 and preferably 2 to 5 silicon atoms. The organopolysiloxane structure preferably may have an alkyl group or a phenyl group from 1 to 8 carbon atoms, more preferably 1 to 4 carbon atoms, such as methyl, ethyl, propyl, and butyl. Also, it may contain a silalkylene structure in which two silicon atoms are linked by an alkylene group, that is, Si—$(CH_2)_n$—Si. In the above formula, n is an integer of 2 to 6, preferably 2 to 4.

As such M, those described below can be mentioned:

[Chem. 29]

-continued

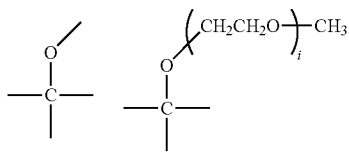

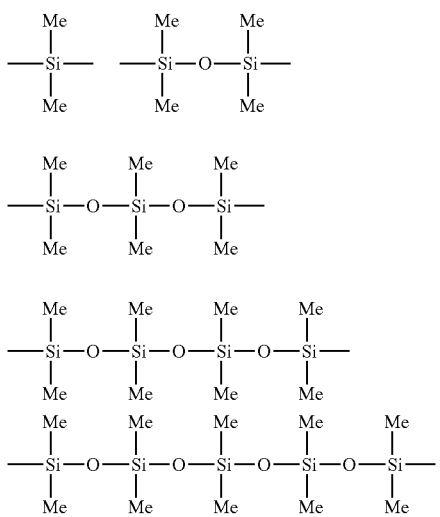

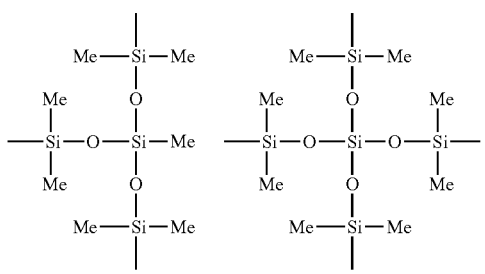

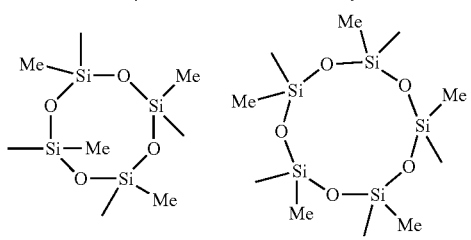

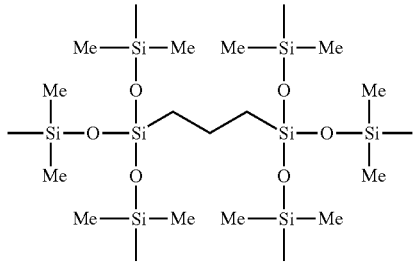

wherein, i is an integer of 1 to 20 and Me is a methyl group.

In the above formulae (1) to (3), W is a monovalent organic group having a hydrolyzable group at a terminal, and is preferably represented by the following formula:

[Chem. 34]

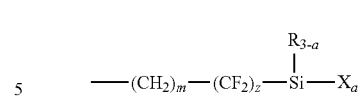

wherein R is an alkyl group having 1 to 4 carbon atoms or a phenyl group, X is a hydrolyzable group, a is 2 or 3, and m is an integer of 0 to 10 and preferably an integer of 2 to 8, z is an integer of 0 to 10, and is preferably an integer of 0 to 6, and each unit indicated in parentheses may be randomly combined.

Examples of X include an alkoxy group having 1 to 10 carbon atoms such as a methoxy group, an ethoxy group, a propoxy group, and a butoxy group, an oxyalkoxy group having 2 to 10 carbon atoms such as a methoxymethoxy group and a methoxyethoxy group, an acyloxy group having 1 to 10 carbon atoms such as an acetoxy group, an alkenyloxy group having 2 to 10 carbon atoms such as an isopropenoxy group, a halogen group such as a chloro group, a bromo group, and an iodo group, and an amino group. Among them, a methoxy group and an ethoxy group are preferable. In the above formula, R is an alkyl group such as a methyl group having 1 to 4 carbon atoms, an ethyl group or a propyl group, or a phenyl group, and among them, a methyl group is preferable. a is 2 or 3, and 3 is preferable from the viewpoint of reactivity and adhesion to the base material.

Examples of the structure represented by —ZW$_\beta$ in the formulae (1) to (3) include the following structures.

[Chem. 35]

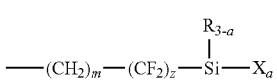
(6a)

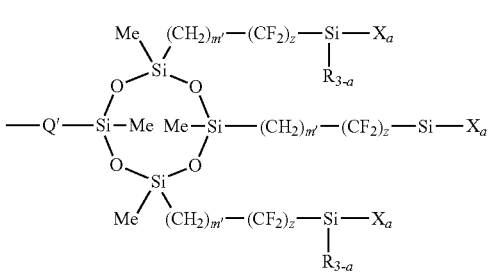
(6b)

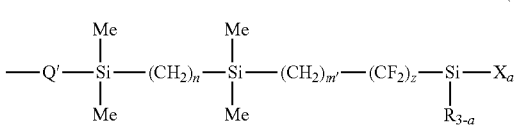
(6c)

[Chem. 36]

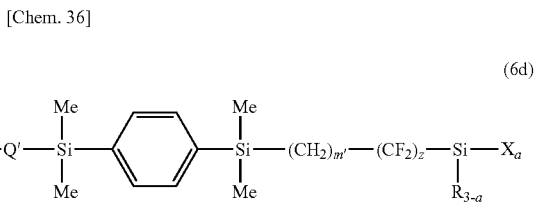
(6d)

(6e)

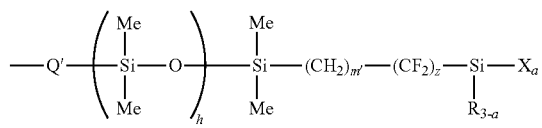

In the formulae (6a) to (6e), R, X, a, m, z, n, and h are as described above, Q' is the same as Q, and m' is an integer of 1 to 10 and is preferably an integer of 2 to 8. Each unit indicated in parentheses enclosed by m or m' and z may be randomly combined. Me is a methyl group.

In the above formulae (4) and (5), Q is a single bond or a divalent organic group, and is a linking group between an Rf group and a Y group. The details of the Q are as described above.

In the above formulae (4) and (5), Y's are independently a divalent organic group having a hydrolyzable group. Preferably, it is represented by the following formula.

[Chem. 37]

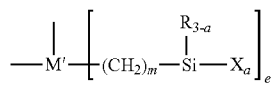

In the formula, R, X, a, and m are as described above. e is an integer of 1 to 3 and is preferably 1 or 2, and M' is an unsubstituted or substituted trivalent to pentavalent, preferably trivalent or tetravalent hydrocarbon group, may be a group obtained by substituting some or all of the carbon atoms in the hydrocarbon group with a silicon atom, or may be a group obtained by substituting some or all of the hydrogen atoms bonded to the carbon atom with a halogen atom such as a fluorine atom. M' is preferably a group represented by the following structure:

[Chem. 38]

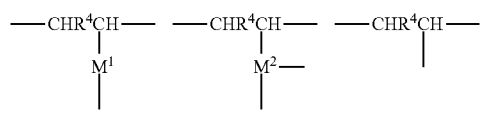

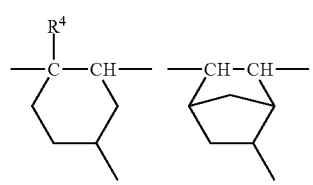

wherein, M' is a divalent hydrocarbon group having 1 to 10 carbon atoms or a diorganosilyl group such as a dimethylsilyl group, and $M^2$ is a trivalent hydrocarbon group having 1 to 10 carbon atoms or an organosilyl group such as a methylsilyl group, and $R^4$ is a hydrogen atom or a monovalent hydrocarbon group having 1 to 6 carbon atoms.

Examples of such Y include the following groups:

[Chem. 39]

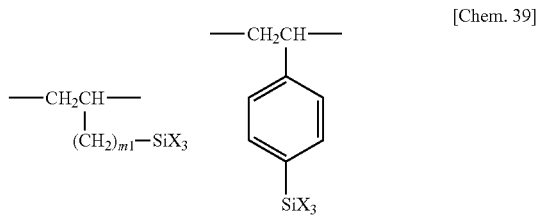

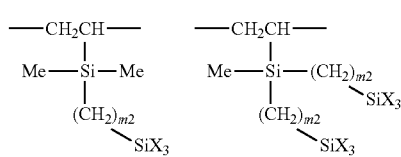

[Chem. 40]

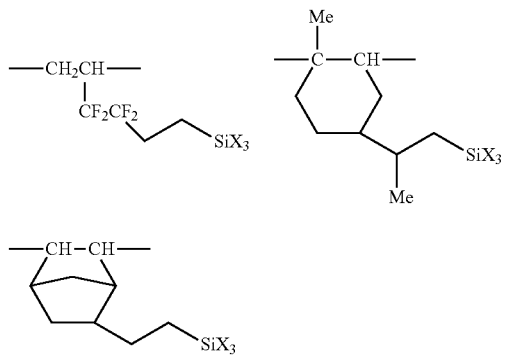

wherein, X is the same as above, m1 is an integer of 0 to 10 and preferably an integer of 1 to 8, and m2 is an integer of 2 to 10 and preferably an integer of 3 to 8, and Me is a methyl group.

In the above formulae (4) and (5), 6 is an integer of 1 to 10 and preferably an integer of 1 to 4.

In addition, B is a hydrogen atom, an alkyl group such as a methyl group having 1 to 4 carbon atoms, an ethyl group, a propyl group, and a butyl group, or a halogen atom such as a fluorine atom, a chlorine atom, a bromine atom, and an iodine atom.

Examples of the fluorine-containing organic silicon compound represented by the above formulae (1) to (5) include those having the following structures:

[Chem. 41]

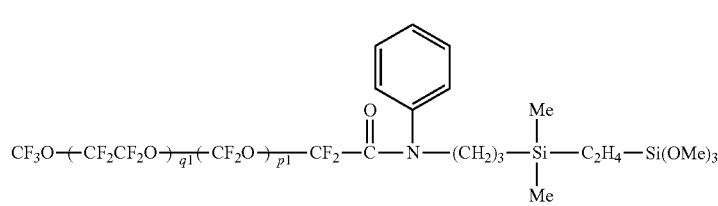

-continued
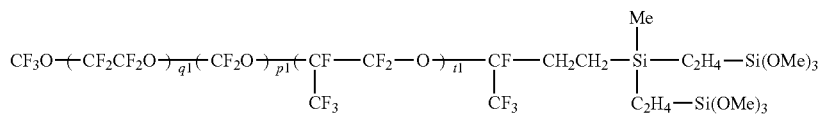
[Chem. 42]
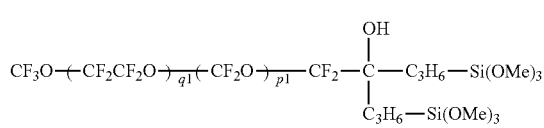
[Chem. 43]
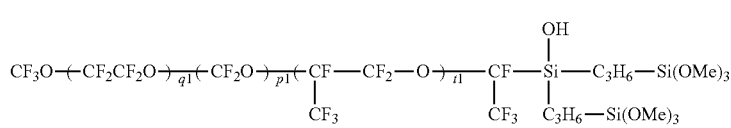
[Chem. 44]
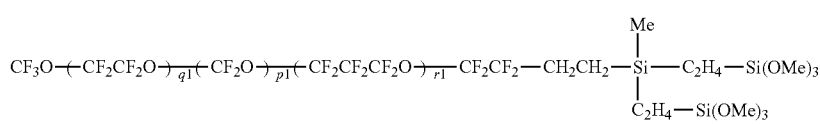
[Chem. 45]
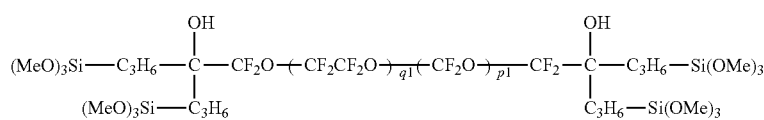
[Chem. 46]
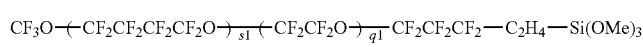
[Chem. 47]
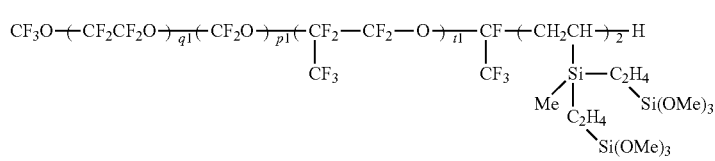
[Chem. 48]
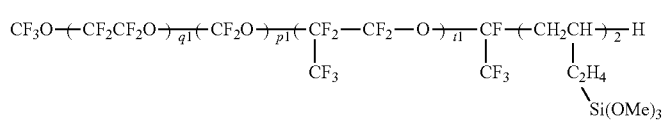
[Chem. 49]
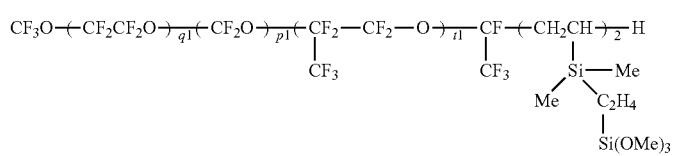
[Chem. 50]
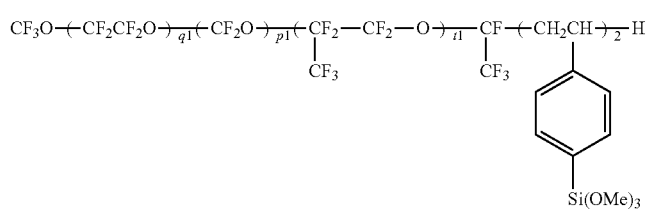
[Chem. 51]
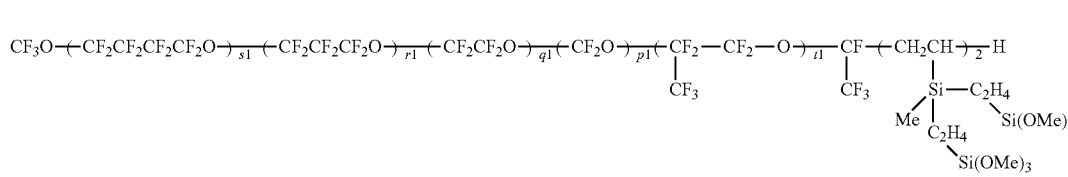
[Chem. 52]

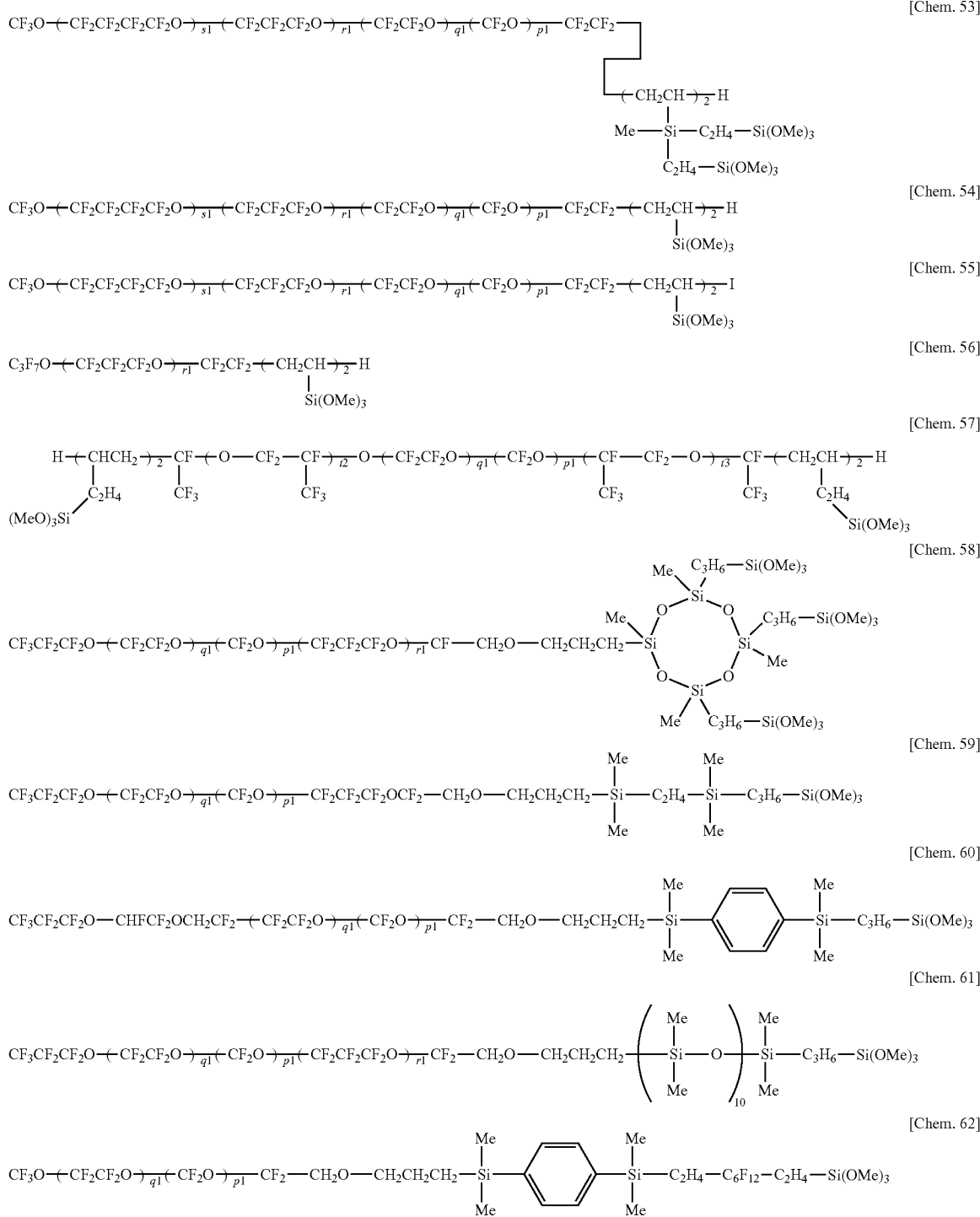

wherein, Me is a methyl group, p1, q1, r1, s1, and t1 are each independently an integer of 1 to 200, t2+t3=t1, and the numerical average molecular weight of the fluoropolymer part is 4,500 to 10,000, and in addition, each unit indicated in parentheses may be randomly combined.

As a principal component of the water- and oil-repellent used in the present invention, it is possible to use a hydrolytsis condensate obtained by hydrolyzing and condensing a hydrolyzable group bonded to a silicon atom in the molecule of the fluorooxyalkylene group-containing polymer modified organosilicon compound.

Further, the water- and oil-repellent according to the present invention may contain a solvent. The solvent is preferably a fluorine-modified aliphatic hydrocarbon solvent (perfluoroheptane, perfluorooctane, or the like), a fluorine-modified aromatic hydrocarbon solvent (m-xylene hexafluoride, benzotrifluoride, 1,3-trifluoromethylbenzene, or the like), a fluorine-modified ether solvent (methyl perfluorobutyl ether, ethyl perfluorobutyl ether, perfluoro (2-butyltetrahydrofuran), or the like), a fluorine-modified alkylamine solvent (perfluorotributylamine, perfluorotripentylamine, or the like), a hydrocarbon solvent (petroleum benzine, mineral spirits, toluene, xylene, or the like), a ketone solvent (acetone, methyl ethyl ketone, methyl isobutyl ketone, or the like). Among them, in terms of solubility, wettability, and the like, a fluorine-modified solvent (referred to as a fluorine solvent) is preferable, and 1,3-trifluoromethylbenzene, m-xylene hexafluoride, perfluoro (2-butyltetrahydrofuran), perfluorotributylamine, and ethylperfluorobutylether are particularly preferable.

The solvent may be a mixture of two or more thereof, and it is preferable to uniformly dissolve the fluorooxyalkylene group-containing polymer modified organosilicon compound and the partial hydrolysis condensate thereof. Note that, the optimum concentration of the fluorooxyalkylene group-containing polymer modified organosilicon compound to be dissolved in the solvent and/or the partial hydrolysis condensate thereof may be appropriately selected according to the method of use of the surface treatment agent, and is not restricted. In general, it is dissolved in an amount of 0.01% to 30% by weight, preferably 0.02% to 20% by weight, and more preferably 0.05% to 5% by weight.

The water- and oil-repellent having as principal components a fluorooxyalkylene group-containing polymer modified organosilicon compound and/or a partial hydrolysis condensate thereof can be applied to the surface of the antireflective layer by using a known method such as a wet coating method (brush coating, dipping, spray, and ink jet). The coating conditions and the like may be in accordance with a conventionally known method, and from the aspect that the antireflective layer is applied by a dry method, it is more efficient to apply the water- and oil-repellent by a vapor deposition method. The method of vapor deposition treatment is not particularly limited, and for example, a resistive heating method or an electron beam heating method can be used.

The thickness of the cured film is appropriately selected depending on the type of the base material to be treated, and is usually 1 to 30 nm, and particularly 3 to 20 nm. In addition, after coating to a thickness of more than 30 nm, a thickness may be adjusted to be 1 to 30 nm by removing the excess water- and oil-repellent or water- and oil-repellent layer by ultrasonic cleaning or hand wiping with pure water or a solvent, or the like before or after the curing treatment.

The water- and oil-repellent can be cured at room temperature (25° C.), but may be heated at 30° C. to 200° C. for about 10 to 24 hours in order to further cure in a short time. Curing is preferably performed under humidification in order to accelerate hydrolysis.

Note that, before applying the water- and oil-repellent, the surface of the antireflective layer may be subjected to cleaning such as a plasma treatment, a UV treatment, a VUV treatment, an excimer treatment, and an ozone treatment, or surface activation. An alkali treatment is not preferable because it may attack the antireflective layer.

Examples of the antireflective member of the present invention include a display such as a car navigation, a tablet PC, a smart phone, a mobile phone, a digital camera, a digital video camera, a PDA, a portable audio player, car audio, and a game machine, a medical instrument such as spectacle lens, camera lens, sunglasses, and a stomach camera, an optical article such as a copy machine, PC, a liquid crystal display, an organic EL display, a plasma display, a touch panel display, a protective film, and antireflective film, and an antifouling coating for window glasses of a vehicle, a train, and an aircraft, and a headlamp cover.

EXAMPLES

Hereinafter, the present invention is specifically described with reference to Examples and Comparative Examples, but the present invention is not limited to these. In the following Examples, Me represents a methyl group.

The test methods used in the Examples and Comparative Examples are as follows.

[Evaluation Method of Water- and Oil-Repellent Properties]

Using a contact angle meter (DropMaster, manufactured by Kyowa Interface Science, Inc), a water contact angle of a cured film (water- and oil-repellent layer) and a contact angle to oleic acid were measured.

[Dynamic Friction Coefficient]

The dynamic friction coefficient of the cured film (water- and oil-repellent layer) against Bencot (manufactured by Asahi Kasei Corporation.) was measured using a surface tester manufactured by Shinto Scientific Co., Ltd. under the following conditions.

Contact area: 10 mm×30 mm
Load: 100 g

[Abrasion Resistance Test]

The abrasion resistance test of the cured film (water- and oil-repellent layer) was performed using a reciprocating abrasion tester (HEIDON 30S, manufactured by Shinto Scientific Co., Ltd.) under the following conditions, and the water contact angle of the cured film after the test was measured by the same method as above.

Evaluation environmental conditions: 25° C., humidity 40%
Abrasive material: Steel wool (#0000 Bonstar) was overlapped and wrapped around a tip (10 mm×10 mm) of the tester in contact with a sample so as to be 3 mm thick, and fixed with a rubber band.
Load: 1 kg
Rubbing distance (one way): 30 mm
Rubbing speed: 3,600 mm/min
Number of reciprocating movements: 5,000 times

[Formation of Antireflective Layer]

Substrates A to F were produced by sequentially forming (multi-layer) antireflective layers on the base material by a vacuum deposition method or a sputtering method using the materials indicated in Table 1. The base material used was Gorilla 3 (glass base material) manufactured by Corning Incorporated. The numerical values in parentheses in Table 1 are the thickness of each layer.

TABLE 1

| Name of substrate | Deposition method | First layer | Second layer | Third layer | Fourth layer | RMS (nm) | Reflectance (%) |
|---|---|---|---|---|---|---|---|
| A | Vacuum deposition | $TiO_2$ (14 nm) | $SiO_2$ (33 nm) | $TiO_2$ (112 nm) | $SiO_2$ (90 nm) | 0.82 | 4.38 |
| B | Vacuum deposition | $TiO_2$ (13 nm) | $SiO_2$ (34 nm) | $TiO_2$ (111 nm) | $SiO_2$ (88 nm) | 0.95 | 4.35 |
| C | Sputtering | $Nb_2O_5$ (12 nm) | $SiO_2$ (34 nm) | $Nb_2O_5$ (116 nm) | $SiO_2$ (86 nm) | 1.09 | 4.86 |
| D | Sputtering | $Nb_2O_5$ (11 nm) | $SiO_2$ (33 nm) | $Nb_2O_5$ (113 nm) | $SiO_2$ (87 nm) | 1.88 | 4.80 |
| E | Sputtering | $Nb_2O_5$ (12 nm) | $SiO_2$ (35 nm) | $Nb_2O_5$ (114 nm) | $SiO_2$ (87 nm) | 2.15 | 4.71 |

TABLE 1-continued

| Name of substrate | Deposition method | First layer | Second layer | Third layer | Fourth layer | RMS (nm) | Reflectance (%) |
|---|---|---|---|---|---|---|---|
| F | Spattering | SiO$_2$ (10 nm) | — | — | — | 0.63 | 8.45 |

Note that, the RMS of the base material Gorilla 3 was 0.45 nm, and the reflectance was 8.46%.

The thickness of each antireflective layer was measured using spectroscopic ellipsometry (M-2000D manufactured by J. A. Woollam).

The root-mean-square surface roughness RMS of the surface of the multi-layered antireflective layer was measured by a scanning probe microscope (SPA 300, cantilever: SI-DF 20, manufactured by Hitachi High-Tech Science Corporation).

Further, the reflectance at an incident angle of 5 degrees was measured using UV-3600 manufactured by Shimadzu Corporation, and the reflectance at a wavelength of 550 nm was adopted.

The following compounds 1 to 5 were used as water- and oil-repellents. The numerical average molecular weight of the fluoropolymer part was measured by $^{19}$F-NMR.

[Compound 1]

[Chem. 63]

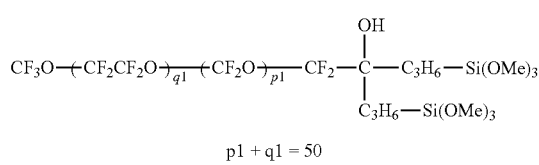

$p1 + q1 = 50$

The numerical average molecular weight of the main chain (fluoropolymer part) is 4,550.

[Compound 2]

[Chem. 64]

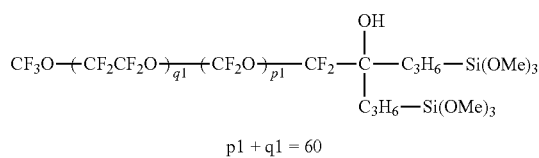

$p1 + q1 = 60$

The numerical average molecular weight of the main chain (fluoropolymer part) is 5,450.

[Compound 3]

[Chem. 65]

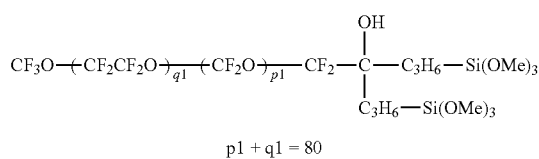

$p1 + q1 = 80$

The numerical average molecular weight of the main chain (fluoropolymer part) is 7,280.

[Compound 4]

[Chem. 66]

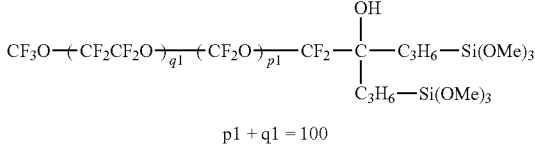

$p1 + q1 = 100$

The numerical average molecular weight of the main chain (fluoropolymer part) is 9,100.

[Compound 5]

[Chem. 67]

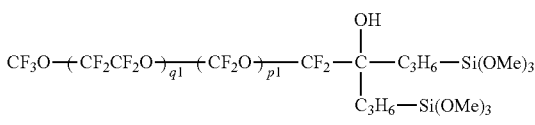

$p1 + q1 = 45$

The numerical average molecular weight of the main chain (fluoropolymer part) is 4,120.

[Formation of Water- and Oil-Repellent Layer]

The above-mentioned compounds 1 to 5 were each diluted with Novec (registered trademark) 7200 (manufactured by 3M) to have an active ingredient content of 20% by weight, and applied onto the antireflective layer of the base material obtained above by a vacuum deposition coating method under the following coating conditions. The coating was cured for 2 hours in an atmosphere of 40° C. and humidity 80% to form a water- and oil-repellent layer, thereby manufacturing an antireflective member.

[Coating Conditions]

Coating device: Small vacuum deposition device VPC-250F

Pressure: $2.0 \times 10^{-3}$ to $3.0 \times 10^{-2}$ Pa

Deposition temperature (attainment temperature of boat): 700° C.

Deposition distance: 20 mm

Preparation amount of treatment agent: 10 mg

Deposition amount: 10 mg (thickness: 15 nm)

Examples 1 to 4 and Comparative Example 1

In Examples 1 to 4 and Comparative Example 1, a water- and oil-repellent layer was formed by using each of the compounds 1 to 5 (those having changed numerical average molecular weight of the water- and oil-repellent) to the above-mentioned substrate A (RMS: 0.82 nm) based on the above method. The above evaluation was performed, and the evaluation results are indicated in Table 2.

TABLE 2

| | Substrate | RMS (nm) | Compound | Numerical average molecular weight | Contact angle (°) Water | Contact angle (°) Oleic acid | Dynamic friction coefficient | After abrasion resistance test Water contact angle (°) |
|---|---|---|---|---|---|---|---|---|
| Example 1 | A | 0.82 | 1 | 4,550 | 116 | 74 | 0.05 | 103 |
| Example 2 | A | 0.82 | 2 | 5,450 | 116 | 75 | 0.04 | 110 |
| Example 3 | A | 0.82 | 3 | 7,280 | 116 | 76 | 0.03 | 111 |
| Example 4 | A | 0.82 | 4 | 9,100 | 116 | 76 | 0.03 | 110 |
| Comparative Example 1 | A | 0.82 | 5 | 4,120 | 115 | 75 | 0.07 | 85 |

Since Comparative Example 1 using the compound 5 having the numerical average molecular weight of less than 4,500 in the main chain (fluoropolymer part) was influenced by surface irregularities, the dynamic friction coefficient was high, and the abrasion resistance was poor. On the other hand, in Examples 1 to 4 using the compound having the numerical average molecular weight of 4,500 or more of the main chain (fluoropolymer part), the dynamic friction coefficient was 0.05 or less, and the abrasion resistance was also excellent.

Examples 5 to 7 and Comparative Example 2

In Examples 5 to 7 and Comparative Example 2, a water- and oil-repellent layer was formed on each of the substrates B to E by using the compound 3 (numerical average molecular weight: 7,280) based on the above method. The above evaluation is performed, and the evaluation results are indicated in Table 3 together with the results of the above Example 3 (using the substrate A and the compound 3).

TABLE 3

| | Substrate | RMS (nm) | Compound | Numerical average molecular weight | Contact angle (°) Water | Contact angle (°) Oleic acid | Dynamic friction coefficient | After abrasion resistance test Water contact angle (°) |
|---|---|---|---|---|---|---|---|---|
| Example 3 | A | 0.82 | 3 | 7,280 | 116 | 76 | 0.03 | 111 |
| Example 5 | B | 0.95 | 3 | 7,280 | 116 | 75 | 0.03 | 110 |
| Example 6 | C | 1.09 | 3 | 7,280 | 116 | 76 | 0.03 | 110 |
| Example 7 | D | 1.88 | 3 | 7,280 | 116 | 76 | 0.05 | 105 |
| Comparative Example 2 | E | 2.15 | 3 | 7,280 | 117 | 76 | 0.08 | 78 |

In Comparative Example 2 in which the RMS of the surface of the multi-layered antireflective layer is greater than 2.0 nm, the effect of surface irregularities was not able to be filled even using a compound having a large numerical average molecular weight of the main chain (fluoropolymer part), and thereby the dynamic friction coefficient was high and the abrasion resistance was poor. On the other hand, in Examples 3 and 5 to 7 in which the RMS of the surface of the multi-layered antireflective layer was 2.0 nm or less, the dynamic friction coefficient was 0.05 or less, and the abrasion resistance was also excellent. Noted that, if a compound having a still larger numerical average molecular weight of the main chain (fluoropolymer part) is used, the desired performance may be able to be exhibited even if the RMS of the surface of the multi-layered antireflective layer is 2.0 nm or more; however, it was not possible to manufacture a polymer having a larger numerical average molecular weight of the main chain (fluoropolymer part).

Comparative Example 3

Although it was not possible to make the RMS of the multi-layered antireflective layer smaller than 0.8 nm in the above Examples/Comparative Examples, for reference, the compound 5 was applied to form a water- and oil-repellent layer on a substrate F (RMS: 0.63 nm) on which a 10 nm a SiO$_2$ layer (single layer) of was formed as a single-layer antireflective layer on a glass base material based on the above method, and evaluation similar to the above was performed. The results indicated in Table 4 were obtained.

TABLE 4

| | Substrate | RMS (nm) | Compound | Numerical average molecular weight | Contact angle (°) Water | Contact angle (°) Oleic acid | Dynamic friction coefficient | After abrasion resistance test Water contact angle (°) |
|---|---|---|---|---|---|---|---|---|
| Comparative Example 1 | F | 0.63 | 5 | 4,120 | 114 | 74 | 0.03 | 110 |

It has been confirmed that the desired characteristics can be exhibited even with the water- and oil-repellent layer using a compound having a numerical average molecular weight of the main chain (fluoropolymer part) of less than 4,500 as long as the RMS of the surface is 0.63 nm on a SiO$_2$ layer (single layer) as a single-layer antireflective layer. However, it was not possible to obtain a sufficient antireflective effect in the single-layer antireflective layer, and it is extremely difficult to stably perform mass-production with less than 0.8 nm of RMS of the multi-layered antireflective layer.

INDUSTRIAL APPLICABILITY

The antireflective member of the present invention is not only excellent in water- and oil-repellent properties, but is low in dynamic friction and easy to wipe off dirt, and can provide a cured film excellent in abrasion resistance. For this reason, in particular, it is very effective for applications where oils and fats are expected to be attached and worn and even in applications such as touch panels that are used and touched on a daily basis, and often have dirt wiping operations, an excellent water- and oil-repellent surface can be maintained over a long period of time.

The invention claimed is:

1. An antireflective member comprising:
a base,
a multi-layered antireflective layer on the base, and
a water- and oil-repellent layer having a thickness of 1 to 30 nm located on the multi-layered antireflective layer;
wherein a surface of the multi-layered antireflective layer most distal to the base has a root-mean-square surface roughness of 0.8 nm or more and 2.0 nm or less, and
wherein the water- and oil-repellent layer is a cured product of water- and oil-repellents having as principal components a fluorooxyalkylene group-containing polymer modified organosilicon compound and/or partial hydrolysis condensate thereof, wherein the fluorooxyalkylene group-containing polymer modified organosilicon compound is represented by the following formula:

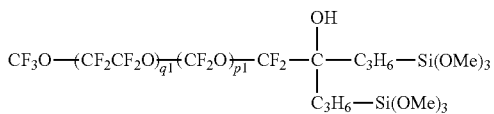

wherein, Me is a methyl group, p1 and q1 are each independently an integer so that the sum of p1+q1 makes the numerical average molecular weight of the

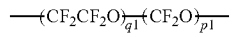

moiety in the formula above 4,550 to 9,100, and in addition, each unit indicated in parentheses may be randomly combined.

2. The antireflective member according to claim 1, wherein the multi-layered antireflective layer is a multi-layered antireflective layer using at least two kinds selected from $MgF_2$, $MgO$, $SiO$, $SiO_2$, $CeF_3$, $NdF_3$, $LaF_3$, $AlF_3$, $YF_3$, $BaF_2$, $CaF_2$, $Al_2O_3$, $SiN_x$ (x is a positive number of 1 to 1.5) $ITO$, $In_2O_3$, $SnO_2$, $ZrO_2$, $TiO_2$, $Ti_2O_3$, $Ti_4O_7$, $Ti_3O_5$, $TiN_{x'}O_y$ (x' is a positive number of 1 to 4 and y is a positive number of 1 to 12), $Nb_2O_5$, $Ta_2O_5$, $Y_2O_3$, $ZnS$, $WO_3$ $HfO_2$, and $La_2Ti_2O_7$.

3. The antireflective member according to claim 1 or 2, wherein the multi-layered antireflective layer is a vacuum vapor deposition film, an ion plating film, an ion assist film, a sputtering film, or a plasma CVD film.

4. The antireflective member according to claim 1, wherein the base material is glass, sapphire, quartz or a transparent resin.

5. The antireflective member according to claim 1, wherein p1+q1 is an integer of 50 to 100.

6. A method of manufacture for the antireflective member according to claim 1, the method comprising:
a step of forming a multi-layered antireflective layer by depositing at least two kinds of antireflective agents a plurality of times by using a vacuum deposition method, an ion plating method, an ion assist method, a sputtering method, or a plasma CVD method, on a base material to make root-mean-square surface roughness of the surface 0.8 nm or more and 2.0 nm or less; and
a step of depositing a water- and oil-repellent having as principal components a fluorooxyalkylene group-containing polymer modified organosilicon compound and/or a partial hydrolysis condensate thereof on the multi-layered antireflective layer by the vacuum deposition method, a spray method, a Dip method, or a spin method to form a water- and oil-repellent layer.

* * * * *